United States Patent [19]
Bion et al.

[11] Patent Number: 5,862,091
[45] Date of Patent: Jan. 19, 1999

[54] MEMORY ACCESSIBLE IN READ MODE ONLY

[75] Inventors: Thierry Bion, Fontaine, France; Richard Ferrant, Berkeley, Calif.

[73] Assignee: SGS-Thomson Microelectronics S.A., Gentilly, France

[21] Appl. No.: 898,499

[22] Filed: Jul. 22, 1997

[30] Foreign Application Priority Data

Jul. 23, 1996 [FR] France ................................... 96 09492

[51] Int. Cl.$^6$ .................................................... G11C 7/02
[52] U.S. Cl. .......................... 365/207; 365/208; 365/104
[58] Field of Search ..................................... 365/184, 203, 365/190, 185.21, 207, 104

[56] References Cited

U.S. PATENT DOCUMENTS

| | | | |
|---|---|---|---|
| 4,404,654 | 9/1983 | Kamuro et al. | 365/103 |
| 4,644,197 | 2/1987 | Flannagan | 365/190 |
| 4,646,265 | 2/1987 | Takamizawa et al. | 365/104 |
| 4,648,074 | 3/1987 | Pollacheck | 365/184 |
| 5,060,190 | 10/1991 | Chen et al. | 365/104 |
| 5,515,327 | 5/1996 | Matsukawa et al. | 365/203 |

FOREIGN PATENT DOCUMENTS

| | | | |
|---|---|---|---|
| 0 105 105 | 4/1984 | European Pat. Off. | G11C 17/00 |
| 0 447 976 A1 | 9/1991 | European Pat. Off. | H01L 27/112 |
| 0 488 672 A2 | 6/1992 | European Pat. Off. | G11C 17/12 |

OTHER PUBLICATIONS

Patent Abstracts of Japan, vol. 009, No. 118 (E–136), May 23, 1985, JP 60009157.
IBM Technical Disclosure Bulletin, vol. 26, No. 10a, Mar. 1984, pp. 5252–5255.

*Primary Examiner*—David Nelms
*Assistant Examiner*—Thong Le
*Attorney, Agent, or Firm*—Allen, Dyer, Doppelt, Milbrath & Gilchrist, P.A.

[57] ABSTRACT

A memory accessible in read mode only comprises storage elements designed to contain a bit that can assume two levels. Each memory cell comprises a transistor. The transistor of the storage element may include an associated circuit portion to prompt a short circuit between the drain and the source of the transistor if the storage element has to contain one bit at one of the two levels. Furthermore, the use of an unbalanced differential amplifier permits an improvement of the access time of the memory.

16 Claims, 4 Drawing Sheets

MEMORY ACCESSIBLE IN READ MODE ONLY

FIELD OF THE INVENTION

The invention relates to a memory accessible in a read mode only, more commonly known as a read-only memory or ROM.

BACKGROUND OF THE INVENTION

A read-only memory is generally used to store a program or data in a unchangeable manner. Such a memory is in fact programmable during a manufacturing step. The use of such a memory is highly varied. For example it is used in chip cards, microcomputers, on-board systems, etc. The main advantage of this type of memory stems essentially from the fact that it is impossible to modify the data, and also from the relatively small surface area that it takes up as compared with PROM, EPROM or EEPROM type memories.

In one application a ROM is used in particular to permanently fix the state of an ASIC using a microprogrammed system, for example of the microcontroller type, that has been developed by means of an EPROM type memory and is intended for mass production. The circuits are smaller and require fewer manufacturing steps (they have no floating gate) when they are produced with ROMs.

In the prior art, there are several known types of ROMs. They can be distinguished, for example, by the type of programming used which corresponds to the structure of a storage element. However, the description shall be limited to MOSFET type memories. Indeed, there are memories using different technologies, for example DTL or TTL technologies, which, however, are not compatible with very highly integrated, low-consumption MOS type circuits.

There are "active level" type ROMs. These storage elements include a transistor represented schematically in FIGS. 1a and 1b. Each of the figures illustrates a possible state of a bit to be memorized. Naturally, the state of the bit is arbitrary and depends on all that is placed between the transistor forming a storage element and the output of the memory. FIG. 1a shows a transistor 1 that has a source connected to the ground, a gate connected to a control line 2 and a drain connected to a bit line 3. When it is desired to select this storage element, the control line 2 is positioned at a positive voltage greater than the threshold voltage of a MOS transistor and the bit line 3 gets connected to the ground by means of the transistor 1. It is assumed that the first level of the memorized bit corresponds to the transistor 1. FIG. 1b shows a transistor 1' that possesses a source connected to the ground, a gate connected to a control line 2' and a drain connected to a bit line 3'. Now, the transistor 1' is totally neutralized by the elimination of the active zone under the control gate. When this storage element has to be selected, the control line 2' is positioned at a positive voltage greater than the threshold voltage of a MOS transistor and the bit line 3' remains in a floating state. It is assumed that the second level of the memorized bit corresponds to the transistor 1'. A cell of this kind has the advantage of having high integration capacity and of using standard methods of manufacture. Unfortunately, the programming by "active level" takes place at the second masking level, namely very early in the manufacturing process. This type of programming done very early in the manufacturing cycle gives rise to major delays (of several weeks) in delivery. Accordingly, the capacity of a company to carry out the high-speed production of circuits that are encoded by the customer is considerably reduced.

There also exist "P minus" type ROMs. The storage elements are shown in FIGS. 2a and 2b. Each of the FIGS. 2a and 2b illustrates a possible state of the bit to be memorized. Naturally, the state of the bit is arbitrary and depends on everything that is placed between the transistor acting as a storage element and the output of the memory. FIG. 2a shows a transistor 4 with a source connected to the ground, a gate connected to the control line 5 and a drain connected to a bit line 6. When it is desired to select this storage element, the control line 5 is set at a positive voltage greater than the threshold voltage of a MOS transistor and the bit line 6 gets connected to the ground by means of the transistor 4. The first level of the memorized bit is considered to correspond to the transistor 4. FIG. 2b shows a transistor 4' with a gate connected to a control line 5', a drain connected to a bit line 6 by means of a reverse-mounted diode 7 and a source connected to the ground. The diode is in fact formed by the implantation of a dopant of a type opposite to the doping of the drain. In general, N channel type transistors are used, the implantation being then made with the P type doping in a low concentration, hence the name "P minus". When it is desired to select this storage element, the control line 5' is positioned at a positive voltage greater than the threshold voltage of a MOS transistor and the bit line 6' remains in a floating state. The second level of the memorized bit is considered to correspond to the transistor 4'. The main advantage of this storage element is that the programming of the element takes place in the second-third part of the manufacturing process, thus reducing delays in delivery. Furthermore, the surface area occupied by the storage element is as small as the previously described element. The main disadvantage is the introduction of an additional step into the standard method for the manufacture of CMOS components. Furthermore, the step added is not compatible with all of the existing methods of manufacture.

There also exists "metal/via" type ROM memories. The storage elements are shown in FIGS. 3a and 3b. Each of the FIGS. 3a and 3b illustrates a possible state of the bit to be memorized. Naturally, the state of the bit is arbitrary and depends on all that is placed between the transistor constituting a storage element and the output of the memory. FIG. 3a shows a transistor 8 with a source connected to the ground, a gate connected to a control line 9 and a drain connected to a bit line 10. When it is desired to select this storage element, the control line 9 is positioned at a positive voltage greater than the threshold voltage of a MOS transistor, and the bit line 10 gets connected to the ground by means of the transistor 8. The first level of the memorized bit is considered to correspond to the transistor 8. FIG. 3b shows a transistor 8' with a source connected to the ground, a gate connected to a control line 9' and a drain disconnected from a bit line 10'. When this storage element is to be selected, the control line 9' is positioned at a positive voltage higher than the threshold voltage of a MOS transistor, and the bit line 10' remains in a floating state. It is felt that the first level of the memorized bit corresponds to the transistor 8'. The connection or non-connection of the transistor is done either by means of a via hole with the highest metal layer or by a strap on the highest metal layer. The main advantage is that the programming of the storage element is done in one of the last two steps of manufacture, thus greatly reducing the delivery delays. Unfortunately, a storage element is at least twice as big as the elements described above. This type of element is therefore not suited to uses involving high-level integration.

All these memory cells have the particular feature of differentiating between the two levels of programming of the storage element either by a transistor or by an open circuit. Consequently, the transistors of the different storage elements are parallel-connected. It is therefore necessary to take account of a minimum spacing between each transistor of each storage element.

SUMMARY OF THE INVENTION

The invention is aimed at proposing a new type of storage element that will run counter to what is being done at the present time. Besides, with the invention, it is possible to make the storage element in a variety of forms so as to give preference either to the surface area for the circuit or to programming speed. Furthermore, the type of storage element proposed by the invention enables a serial type of arrangement that is more advantageous than what is done in the prior art.

An object of the invention is a memory accessible in read mode only, comprising storage elements designed to contain a bit that can assume two levels, each memory cell comprising a transistor wherein, if the storage element has to contain one bit at one of the two levels, then means associated with the transistor of the storage element prompt a short circuit between the drain and the source of this transistor. The effect of short-circuiting the drain and the source of the transistor is that there is a first state of the memorized bit that corresponds to a short circuit, and a second state of the memorized bit that corresponds to the presence of the transistor.

Depending on the desired optimization (surface area or speed of delivery), two embodiments are presented. In a first embodiment, the associated means comprises an active zone doped with a dopant of the same type as the dopant used for the source and the drain. We thus have a storage element which has the size of a transistor and the advantage of being programmed at about the middle of the manufacturing cycle. In a second embodiment, the associated means comprises a connection of the source and of the drain. This connection is obtained by means of a metal layer. Here we have a slightly larger element whose advantage is that it can be programmed in one of the last two manufacturing steps.

A particular arrangement of the storage elements has additional advantages. Indeed, with a memory organized in at least one group of storage elements arranged in m rows and n columns, m and n being positive integers, it is possible to series-connect the storage elements belonging to one and the same column. A structure of this kind in fact enables the use of the source of a transistor as a drain for the neighboring transistor, thus reducing the average surface area of a transistor. Depending on the number of storage elements that are connected in series, the total surface area of the memory is reduced by about 25% to 30%.

The use of series-connected MOS transistors creates a resistive load, and the greater the number of storage transistors, the greater is the resistive load. Now the greater this resistive load, the greater is the reading time. Accordingly, the invention overcomes this problem and proposes a memory accessible in read mode only comprising storage elements arranged in rows and columns, designed to contain a bit that may take two levels, each storage element comprising a transistor, and means associated with the transistor of the storage element prompting a short circuit between the drain and the source of the transistor if the storage element must contain a bit in one of the two levels All of the transistors of the storage elements belonging to one and the same column are series-connected, and the drain of a transistor that is at a first end of a column is connected to a first input of a differential amplifier. The differential amplifier also has a second input, and with the first and second inputs being balanced with respect to each other.

The invention also proposes a memory accessible in read mode only, comprising storage elements positioned in rows and columns, designed to contain a bit that can take two levels, each storage element comprising a transistor, and means associated with the transistor of the storage element prompting a short circuit between the drain and the source of the transistor if the storage element must contain a bit in one of the two levels. All of the transistors of the storage elements that belong to one and the same column are series-connected, and the drain of a transistor that is located at a first end of a column is connected to the drain of a pre-charging transistor. The drain of the pre-charging transistor is connected to a first input of a differential amplifier, and the second input of the differential amplifier is connected to a reference transistor identical to the pre-charging transistor.

BRIEF DESCRIPTION OF THE DRAWINGS

Other particular features and advantages shall appear from the following description of a preferred embodiment that in no way restricts the scope of the invention, the description being made with reference to the appended drawings, of which.

DETAILED DESCRIPTION OF THE PREFERRED EMBODIMENTS

Figure 1A:
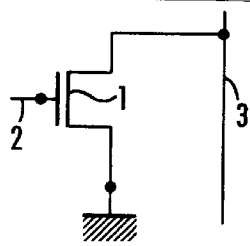
FIGS. 1a, 1b, 2a, 2b, 3a and 3b give a schematic view of the storage elements according to the prior art, FIGS. 4a, 4b, 5a and 5b give a schematic view of the storage elements according to the invention.
Figure 2A:
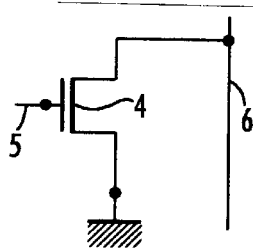
Figure 3A:
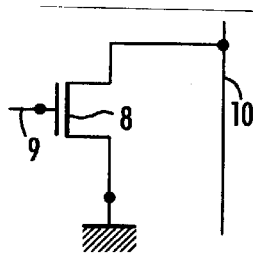
Figure 1B:
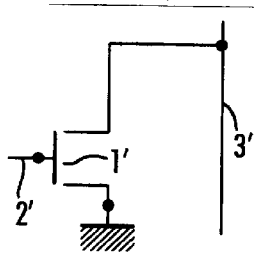
Figure 2B:
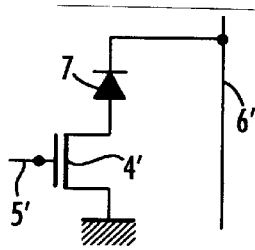
Figure 3B:
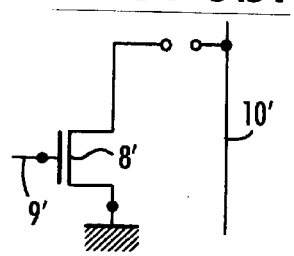
Figure 4A:
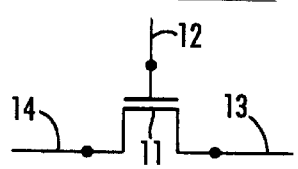

FIG. 4a shows a schematic view of the transistor 11 of a storage element. The gate of this transistor 11 is connected to a selection line 12, the drain is connected to a bit line 13 and the source is connected to a zero potential 14. When the storage element has to be selected, a zero voltage is sent on the selection line 12. The transistor is turned off. When the storage element has to be de-selected, the selection line is placed at a potential greater than the threshold voltage of a MOS transistor, turning the transistor on. The transistor 11 of FIG. 4a corresponds to one of the two states possible for the storage element.

Figure 4B:
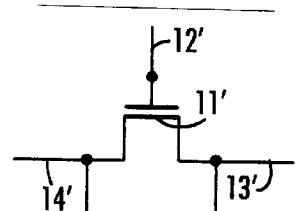

FIG. 4b shows a schematic view of the transistor 11' of a storage element. The base of this transistor 11' is connected to a selection line 12', the drain is connected to a bit line 13' and the source is connected to a zero potential 14'. Furthermore, a strap 15 short circuits the drain and the source of the transistor 11'. Whatever the voltage present on the selection line 12', the transistor is on (or at least considered to be on). The transistor of FIG. 4b corresponds to the other of the two possible states for the storage element.

The strap 15 may be made at the last metallization level. The programming of the storage element takes place at one of the last two steps of manufacture. However, for this particular embodiment, the only advantage arises out of the arrangement that can be made, which shall be explained here below. The gain in surface area must compared with the prior art memories of the "metal/via" type.

Figure 5A:
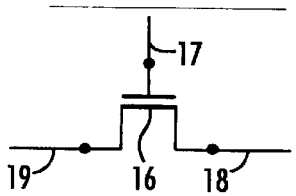
Figure 5B:
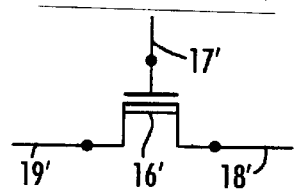

By contrast, there is a second embodiment shown schematically in FIGS. 5a and 5b. FIG. 5a shows a storage element comprising a MOSFET type N channel transistor 16 having its base connected to the selection line 17, its drain connected to a bit line 18 and its source connected to a zero voltage 19. This FIG. 4a shows the programming in one of the two states of the bit memorized by the storage element.

FIG. 5b shows a storage element comprising a MOSFET type N channel depleted transistor 16' having its base connected to a selection line 17', its drain connected to a bit line 18' and its source connected to a zero voltage 19'. This FIG. 4a shows the programming in the other of the two states of the bit memorized by the storage element.

In fact, the depleted transistor may be made either during the "Vt depletion" step used to make depleted transistors or during the step for the constitution of capacitors. In fact, the active zone of the transistor is doped by means of impurities of the same type as that of the drain and of the source of the transistor 16'.

Figure 6:
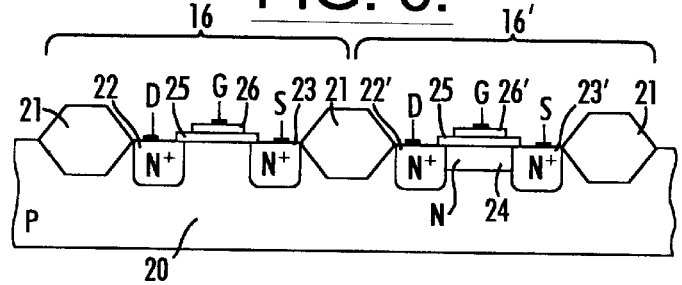
FIG. 6 shows a sectional view of transistors that can be used as storage elements according to the invention.

FIG. 6 shows a sectional view of the two transistors 16 and 16' that correspond to the two states of the storage element. On a P type substrate 20, thick oxide zones 21 are grown. These zones insulate the transistors 16 and 16' laterally. Then in the next steps, the active zones (drains 22, 22' and sources 23, 23') of the transistors 16 and 16' are implanted with N type impurities in a certain concentration. Then a second implantation is made solely beneath the gate of the transistor 16' to form a permanent channel 24. The necessary operations of masking and implantation are merged with identical operations aimed, for example, at making an integrated capacitor electrode. Then, the manufacturing steps well known to those skilled in the art succeed one another: these are the deposition of a gate oxide 25 of the channel of the transistors 16 and 16', the deposition of the gates 26 and 26' made of polysilicon and the deposition of the different layers of insulator and metal (not shown). The transistors 16 and 16' thus made truly correspond to two distinct states: either there is a standard MOS transistor or a permanent channel MOS transistor.

Conventionally, the depleted transistors are used to have zero threshold voltages. In the invention, the channel located beneath the gate of the transistor is doped to make this threshold voltage negative, namely for a positively biased circuit, this transistor is always on irrespective of the voltage present at the gate 26'. The gate voltage will in fact only have the effect of modulating the thickness of the channel. This corresponds to the modulation of the resistivity of the channel.

The elements using a channel that is always on actually have the size of a simple transistor. This corresponds to the smallest existing memory cell. Furthermore, as compared with these "active level" memories (of the same size), the programming takes place a little later in the manufacturing process, thus reducing business delays.

One form of organization of the memory makes the above-defined storage elements even more advantageous. Indeed, we have defined a new type of storage element which is not compatible with a presently made memory architecture organized in parallel-connected columns of transistors. Furthermore, there is no question of associating an additional selection transistor for each storage element as in the case of the EEPROM memories.

Figure 7:
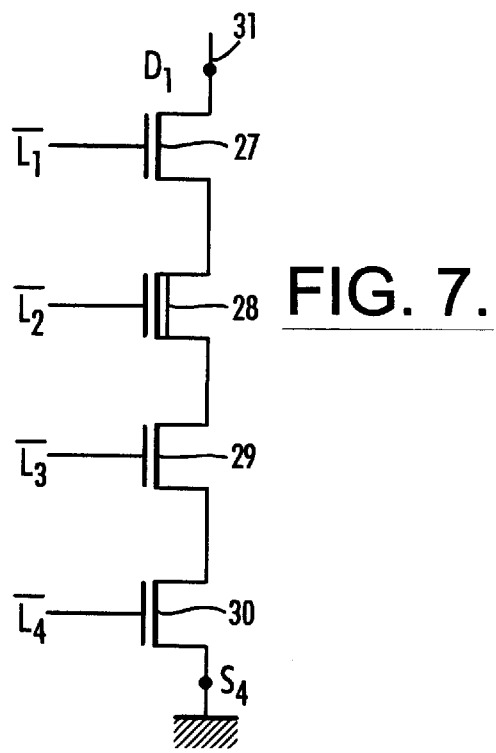
FIG. 7 shows an arrangement of storage elements according to the invention.

FIG. 7 shows an exemplary architecture of a memory column according to the invention. Four transistors 27 to 30 are series-connected. Each of the four transistors 27 to 30 represents a distinct bit to be stored. In the example, the transistors 27, 29 and 30 represent bits in a first state and the transistor 28 represents a bit in a second state. The bits of the four transistors 27 to 30 are respectively connected to the selection lines /L1 to /L4. These selection lines /L1 to /L4 are active when they are at a voltage lower than the threshold voltage of a standard MOS transistor (called a level 0 transistor) and they are inactive when they are at a voltage greater than the threshold voltage of a standard MOS transistor (called a level 1 transistor). The source S4 of the transistor 30 located at one end of the column is connected to the ground. The drain D1 of the transistor 27 located at the other end of the column is connected to a bit line 31 which may be connected for example to a shaping device.

When none of the selection lines /L1 to /L4 is selected, then all the selection lines are at the level 1, turning the four transistors 27 to 30 on. The bit line 31 is therefore connected to the ground. When it is desired to select the transistor, then the associated selection line is positioned at 0. If it is a standard MOS transistor 27, 29 or 30, then the transistor 27, 29 or 30 is turned off and the bit line 31 becomes floating. If it is a depleted transistor 28, then the channel of the depleted transistor 28 diminishes but remains on, the bit line 31 then remains connected to the ground.

The shaping means must differentiate between the connections to the ground and the floating levels of the bit line 31. For this purpose it is possible for example to connect a pull-up resistor to this bit line. Those skilled in the art will easily understand that it is theoretically possible to connect as many transistors as desired in series in a column. In fact, the series connection of the transistors creates a resistance that is as great as there are transistors in the column. Furthermore, the shaping means conventionally used create a capacitive charge. The coupling of a column with shaping means creates an RC cell that slows down the reading operation. This phenomenon is already partially known in the prior art where C varies only as a function of the number of transistors. Compromises therefore have to be found for those skilled in the art to obtain a desired speed.

Figure 8:
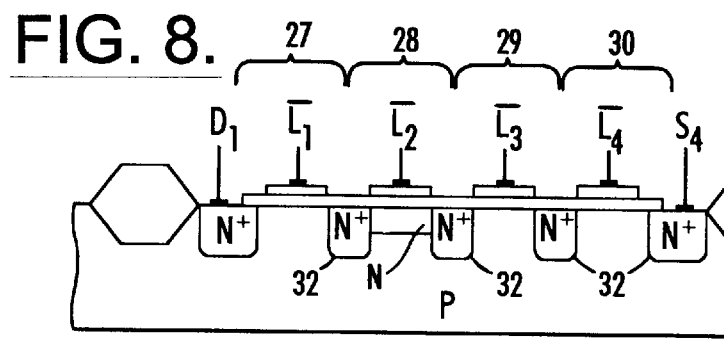
FIGS. 8 and 9 show a sectional view of the arrangement of FIG. 7, FIGS. 10 and 11 give a schematic view of a memory according to the invention arranged in blocks.

FIG. 8 shows a longitudinal sectional view of the substrate at the level of the transistors 27 to 30. As can be seen in FIG. 8, the connection between the drain and the source for two transistors placed side-by-side is made by using implantations that are pooled. For example, the implantation 32 corresponds both to the source of the transistor 27 and the drain of the transistor 28. A structure of this kind enables the reduction of the average size of the transistors 27 to 30. Furthermore, the implantations may be reduced to the minimum size.

Figure 9:
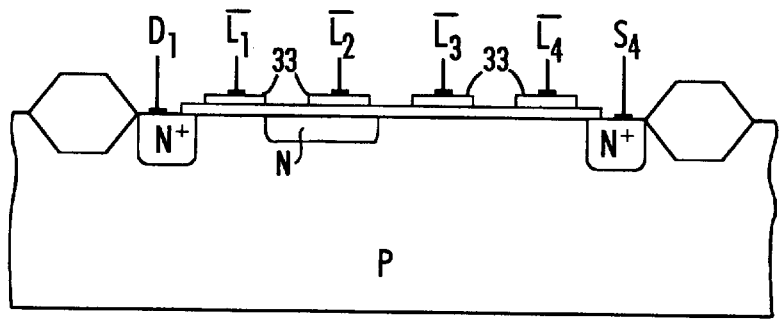

In certain submicron technologies, it is even possible to eliminate the drain/source implantations as can be seen in FIG. 9. This is possible if the gates 33 can be brought sufficiently close to each other. Indeed, when the gates 33 are sufficiently close to each other, the gates produce channels whose apertures overlap. The space between two transistors then becomes equal to the minimum space permitted between each gate. However, in certain older technologies, the constraints of minimum space between two gates 33 make it impossible to obtain the embodiment of FIG. 9.

The structure used for the series connection of the transistors of the storage elements therefore enables the size of these transistors to be reduced to about 50%. However, as seen here above, it is not possible to have as many storage elements as are obtained with parallel-connected elements. Hence a memory is made with a certain number of blocks of limited size.

Figure 10:
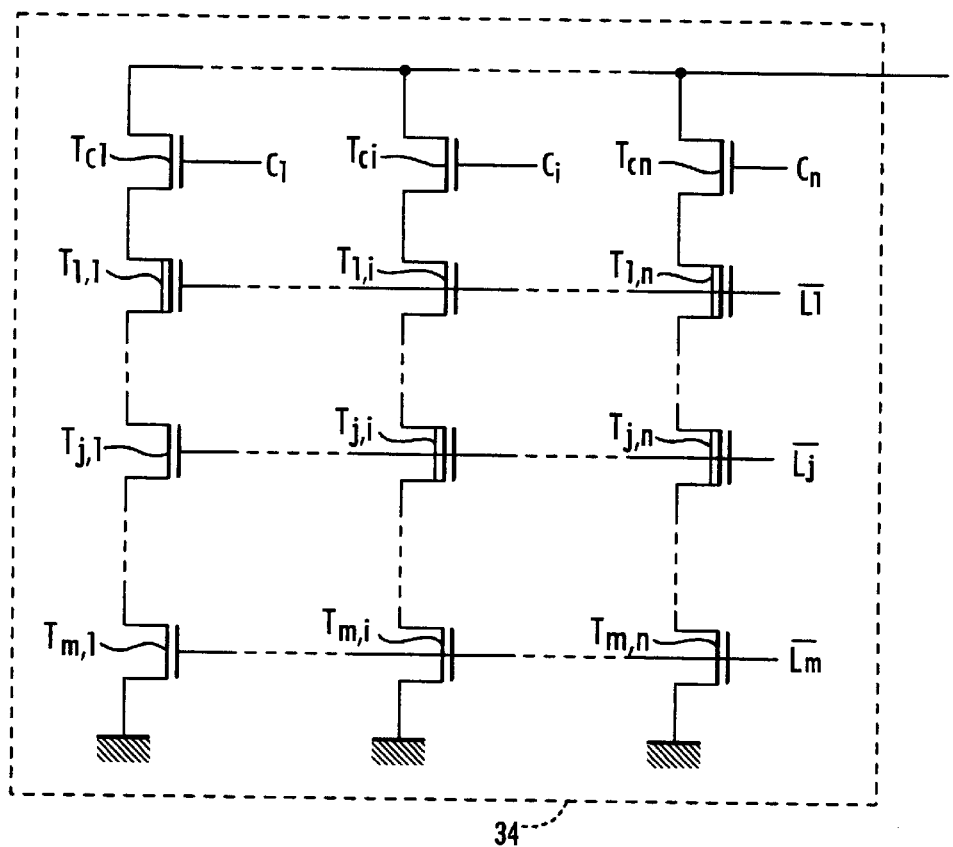

FIG. 10 shows a block 34 of storage elements comprising n columns of m storage elements forming a matrix with m times n storage transistors. Naturally, a small-size memory may have only one block of this type. The block 34 of FIG. 10 has n columns, each $i^{th}$ column comprising m storage transistors $T_{1,i}$ to $T_{m,i}$ having an N type channel. Furthermore, each of the columns has a column selection transistor $T_{C1}$ to $T_{Cn}$ having an N type channel series-connected with the storage transistors $T_{j,i}$. Preferably, the column selection transistors $T_{C1}$ to $T_{Cn}$ have been placed at the end of the columns corresponding to the output of the block 34. In fact, in a functional way, these column selection transistors $T_{C1}$ to $T_{Cn}$ can be series-connected with the transistors $T_{j,i}$ anywhere on the column. A first end of each column is connected to a common output of the block 34. A second end of each column is connected to the ground. To have efficient operation, it is sufficient to select the control lines $/L_1$ to $/L_m$ with levels that are active in the low state and to select the columns with signals $C_1$ to $C_n$ that are active in the high state. It is of course necessary to have a decoding logic that prevents the simultaneous selection of several rows or several columns. The output of the block 34 normally gives either a logic "1" (a resistive connection with the ground), or a high impedance state depending on the selected row and column.

Figure 11:
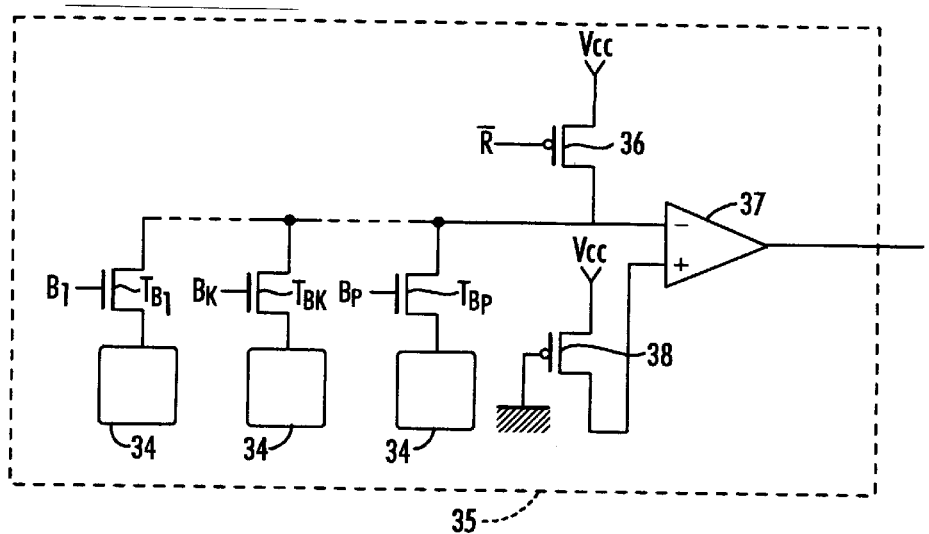

FIG. 11 shows a read circuit 35. This circuit 35 has p blocks 34. The output of each of these blocks 34 is connected to the drain of a pre-charging transistor 36 having a P type channel by means of a block selection transistor $T_{B1}$ to $T_{Bp}$ having an N type channel. The gates of the block selection transistors $T_{B1}$ to $T_{Bp}$ receive selection signals $B_1$ to $B_p$ that are active at the high state and only one of which is active. The pre-charging transistor 36 has its source connected to the supply voltage VCC and its gate receives a read signal R that is active in the high state. The reading phase is preceded by a pre-charging phase during which the signal R is positioned in the low state. The pre-charging transistor 36 goes alternately from an on state (pre-charging state) to an off state (reading state).

At the end of the pre-charging phase, the output of the block 34 is positioned at VCC by means of the pre-charging transistor 36. During the next phase (reading phase), the output of the block 34 evolves differently depending on two possible cases. When the output of the block 34 is at high impedance, its high level reached at the end of the pre-charging is maintained. On the contrary, when the output of the block 34 gives a low level, its initial level reached at the end of pre-charging gradually decreases towards "0".

Preferably, the device used is an analog comparator 37 of the high gain differential amplifier type, having two inputs and one output. The first input of the comparator 37 is connected to the drain of the pre-charging transistor 36. The second input of the comparator 37 is connected to the drain of a reference transistor 38. The output of the comparator 37 corresponds to the output of the read circuit 35. The reference transistor 38 is identical to the pre-charging transistor 36. The source of the reference transistor 38 is connected to the supply voltage VCC and the gate of this transistor 38 is connected to the ground in such a way that this reference transistor 38 is always on.

In a first stage, it is assumed that the comparator 37 is a differential amplifier working between zero volts and VCC that has high gain and works almost perfectly. When the output of the block 34 selected is at high impedance, the two inputs of the comparator 37 are at the same potential. Hence, the output of the amplifier must be at a level corresponding normally to the midpoint of the supply, namely VCC/2. When the output of the block 34 selected is at a logic zero, then the first input of the comparator 37 is at the voltage lower than the second input of the comparator 37. Hence the high gain of the amplifier will amplify this difference up to the saturation of the output (with the inverter and non-inverter inputs connected as in the drawing, this gives an output at VCC).

As the comparator 37, it is proposed to use a high gain amplifier with low sensitivity such that it has an important offset voltage in such a way that, in the event of equality of voltage between its inputs, the amplifier behaves as if its first input were at a voltage greater than its second input (in this case, the output of the amplifier is positioned at the low level).

Figure 12:
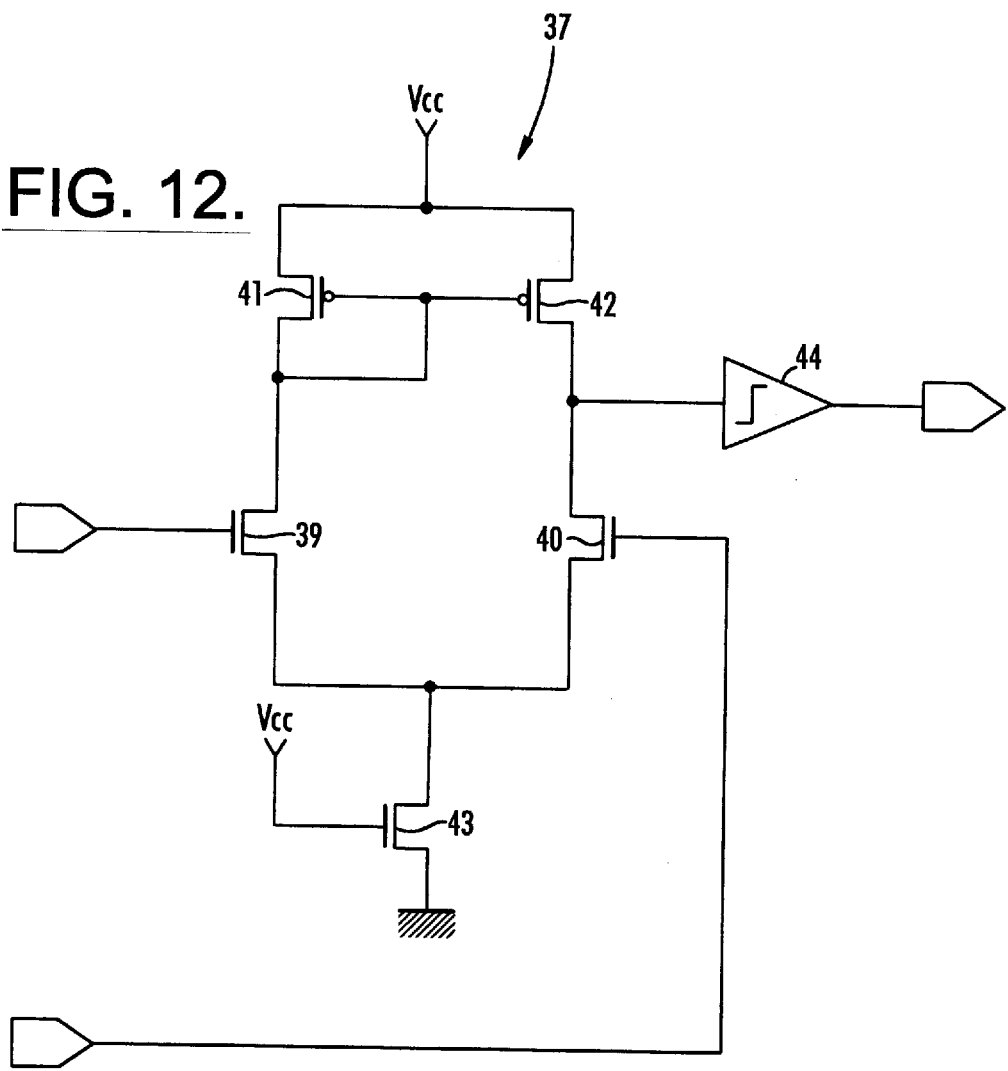
FIG. 12 is a schematic circuit diagram of the differential amplifier according to the invention.

FIG. 12 shows a preferred embodiment of the differential amplifier used as a comparator 37. The differential amplifier has first and second N channel MOS type input transistors 39 and 40, first and second P channel MOS type mirror transistors 41 and 42, an N channel MOS type bias transistor 43 and a high gain amplifier 44.

The sources of the first and second mirror transistors 41 and 42 are connected to the supply voltage VCC and their gates are connected to the drain of the first mirror transistor 41. The sources of the first and second input transistors 39 and 40 are connected to the drain of the bias transistor 43, and their drains are respectively connected to the drains of the first and second mirror transistors 41 and 42. The bias transistor 43 has its gate connected to the supply voltage VCC and its source connected to ground. The gate of the first input transistor 39 is connected to the first input of the comparator 37. The gate of the second input transistor 40 is connected to the second input of the comparator 37.

The drain of the second input transistor 40 is connected to the output of the comparator 37 by means of the high gain amplifier 44. This amplifier structure is well known to those skilled in the art. The high gain amplifier 44 is used to amplify the current difference present in the two arms of the differential stage and behaves like a threshold buffer-type shaping circuit if the operation is an open loop operation.

To unbalance the amplifier, two possibilities are proposed in the invention. The first possibility includes the use of a first input transistor 39 that has a channel width that is wider than the channel of the second input transistor 40 with a same channel length. The second possibility includes the use of a second mirror transistor 42 having a wider channel than the channel of the first mirror transistor 41. Accordingly, with the two possibilities, a similar result is obtained with the effect of producing an output current corresponding to a higher voltage at the first input, when the voltages at the second input are identical or when the voltage at the first input is slightly smaller than the voltage at the second input.

To reduce the size of the differential stage while keeping an equivalent effect, it is recommended that both possibilities be used simultaneously. Simultaneous use further enables a reduction of the gate capacities and the obtaining of a faster reaction of the differential stage. Very good results are obtained with a first input transistor 30 that is about three times wider than the second input transistor 40 and a second mirror transistor 42 that is three times wider than the first mirror transistor 41 (with transistors of the same length).

Simulations have been carried out on 64 Ko memories organized in eight-bit words at the optimization stage. The typical access time (at 5 volts and 25° C.) is 6.5 ns and 14.5 ns under the "worst case" conditions (4 V, 125° C.). Electrical performance characteristics of this kind are far higher (about three times faster) than those existing previously with "active level" and "P minus" type memories of the same capacity. Furthermore, with a columnwise organization using eight transistors forming storage cells, the gain in surface area is 25% as compared with an "active level" type memory. With 16 transistors, a reduction of 32% in surface area is obtained. To make up for the impairment of the electrical performance characteristics, it is necessary to add faster decoding and reading circuits which are bigger in terms of greater surface area but may very well take up less space than the amount of space gained during the series connection of the transistors.

It is possible to use many variants to optimize the positioning and routing of a memory. Most of the variants arise out of methods already known for standard memories. One additional possibility includes interleaving the different blocks 34 with one another. This means that, between two columns of a block, it is possible to interpose columns belonging to the other blocks in order to benefit from a common gate for the selection transistors $T_{Ci}$ of different blocks 34, thus reducing the number of interconnections.

In the above description, certain choices have been made with respect to the doping of the transistors and the connections to VCC and the ground. Those skilled in the art could easily find the complementary approach by replacing N type dopings with P type dopings and vice versa in taking care to invert the ground and VCC. However, it is preferred to use N channel transistors as memory cells because the resistance of an N type channel is smaller than that of a P type channel with equal doping.

Furthermore, the obtaining of the invention by means of a metal strap has not been described in detail for it would be enough to adapt the abovedescribed arrangement. This can be done by anyone skilled in the art.

What is claimed is:

1. A memory accessible in a read mode only comprising:
    a plurality of storage elements arranged in rows and columns, each storage element for containing a bit that can assume one of two levels, and each storage element comprising
       a transistor having a drain and a source, and
       short circuit prompting means associated with the transistor for prompting a short circuit between the drain and the source of said transistor if the storage element has to contain one bit at one of the two levels;
    all the transistors of the storage elements belonging to one and the same column being series-connected; and
    a differential amplifier having first and second inputs internally unbalanced with respect to each other, the first input being connected to the drain of a transistor that is located at a first end of a column.

2. The memory according to claim 1, further comprising a pre-charging transistor having a drain connected to the first input of said differential amplifier.

3. The memory according to claim 2, further comprising a reference transistor identical to the pre-charging transistor and being connected to the second input of said differential amplifier.

4. The memory according to claim 2, wherein the pre-charging transistor has a doping different from a doping of the transistors of said storage elements.

5. The memory according to claim 1, further comprising at least one selection transistor connecting the drain of the transistor located at the first end to the first input of said differential amplifier.

6. The memory according to claim 1, wherein the differential amplifier comprises first and second input transistors whose gates respectively receive signals corresponding to the signals received by the first and second inputs of said differential amplifier, and wherein the first and second input transistors have different sizes.

7. The memory according to claim 6, wherein the first input transistor has a channel proportionately wider than a channel of the second input transistor.

8. The memory according to claim 1, wherein said differential amplifier comprises first and second mirror transistors connected to form a current mirror to copy current between two arms of a differential stage of the differential amplifier, and wherein the first and second mirror transistors have different sizes.

9. The memory according to claim 8, wherein the first mirror transistor copies the current into an arm corresponding to the first input of the differential amplifier and the second mirror transistor gives a current on the arm corresponding to the second input of the differential amplifier; and wherein the second mirror transistor has a channel proportionately wider than the channel of the first mirror transistor.

10. A memory accessible in a read mode only, comprising:
    a plurality of storage elements arranged in rows and columns, each storage element for containing a bit that can assume one of two levels, and each storage element comprising
       a transistor having a drain and a source, and
       short circuit prompting means associated with the transistor for prompting a short circuit between the drain and the source of said transistor if the storage element has to contain one bit at one of the two levels;
    all the transistors of the storage elements belonging to one and the same column being series-connected;
    a pre-charging transistor having a drain connected to the drain of a transistor that is located at a first end of a column;
    a reference transistor identical to the pre-charging transistor; and
    a differential amplifier having a first input connected to the drain of the pre-charging transistor and a second input connected to the reference transistor, the first and second inputs of said differential amplifier being internally unbalanced.

11. The memory according to claim 10, wherein the pre-charging transistor has a doping different from a doping of the transistors of the storage elements.

12. The memory according to claim 10, further comprising a selection transistor having a drain connected to the drain of the transistor located at the first end.

13. The memory according to claim 10, wherein said differential amplifier comprises first and second input transistors whose gates respectively receive signals corresponding to the signals received by the first and second inputs of the differential amplifier; and wherein the first and second input transistors have different sizes.

14. The memory according to claim 13, wherein the first input transistor has a channel proportionately wider than a channel of a second input transistor.

15. The memory according to claim 10, wherein said differential amplifier comprises first and second mirror transistors connected to form a current mirror used to copy the current between two arms of a differential stage of the differential amplifier, and wherein the first and second mirror transistors have different sizes.

16. The memory according to claim 15, wherein the first mirror transistor copies the current into the arm corresponding to the first input of the differential amplifier and the second mirror transistor gives a current on the arm corresponding to the second input of the differential amplifier; and wherein the second mirror transistor has a channel proportionately wider than the channel of the first mirror transistor.

* * * * *

UNITED STATES PATENT AND TRADEMARK OFFICE
CERTIFICATE OF CORRECTION

PATENT NO. : 5,862,091
DATED : January 19, 1999
INVENTOR(S) : Thierry Bion, and Richard Ferrant It is certified that error appears in the above-identified patent and that said Letters Patent is hereby corrected as shown below:

Column 7, Line 26    Strike:    ' logic "1" '

Insert:    -- logic "0" --

Signed and Sealed this

Twenty-second Day of June, 1999

Attest:

Q. TODD DICKINSON

*Attesting Officer*    Acting Commissioner of Patents and Trademarks